US008723271B2

(12) United States Patent
Yuan et al.

(10) Patent No.: US 8,723,271 B2
(45) Date of Patent: May 13, 2014

(54) VOIDS IN STI REGIONS FOR FORMING BULK FINFETS

(71) Applicant: Taiwan Semiconductor Manufacturing Company, Ltd., Hsin-Chu (TW)

(72) Inventors: Feng Yuan, Yonghe (TW); Tsung-Lin Lee, Hsin-Chu (TW); Hung-Ming Chen, Hsin-Chu (TW); Chang-Yun Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/918,728

(22) Filed: Jun. 14, 2013

(65) Prior Publication Data

US 2013/0277757 A1 Oct. 24, 2013

Related U.S. Application Data

(62) Division of application No. 12/612,442, filed on Nov. 4, 2009, now Pat. No. 8,519,481.

(60) Provisional application No. 61/251,587, filed on Oct. 14, 2009.

(51) Int. Cl.
H01L 27/02 (2006.01)
(52) U.S. Cl.
USPC .......................................................... 257/386
(58) Field of Classification Search
USPC .............................. 257/368, E27.06, E21.546
See application file for complete search history.

(56) References Cited

U.S. PATENT DOCUMENTS

| 6,180,490 | B1 | 1/2001 | Vassiliev et al. |
| 6,248,644 | B1 | 6/2001 | Yang et al. |
| 6,706,571 | B1 | 3/2004 | Yu et al. |
| 6,858,478 | B2 | 2/2005 | Chau et al. |
| 6,949,768 | B1 | 9/2005 | Anderson et al. |
| 7,129,541 | B2 | 10/2006 | Kim et al. |
| 7,190,050 | B2 | 3/2007 | King et al. |
| 7,247,887 | B2 | 7/2007 | King et al. |
| 7,265,008 | B2 | 9/2007 | King et al. |
| 7,508,031 | B2 | 3/2009 | Liu et al. |
| 7,528,465 | B2 | 5/2009 | King et al. |
| 7,605,449 | B2 | 10/2009 | Liu et al. |
| 7,989,856 | B2 | 8/2011 | Goto et al. |
| 2005/0153490 | A1 | 7/2005 | Yoon et al. |
| 2007/0120156 | A1 | 5/2007 | Liu et al. |
| 2007/0122953 | A1 | 5/2007 | Liu et al. |
| 2007/0122954 | A1 | 5/2007 | Liu et al. |

(Continued)

FOREIGN PATENT DOCUMENTS

| JP | 2008160125 A | 7/2007 |
| JP | 2007273794 A | 10/2007 |
| JP | 2008147269 A | 6/2008 |
| JP | 2009147194 | 7/2009 |
| KR | 1020060107406 | 10/2006 |
| KR | 20070064346 | 6/2007 |

Primary Examiner — Zandra Smith
Assistant Examiner — Paul Patton
(74) Attorney, Agent, or Firm — Slater and Matsil, L.L.P.

(57) ABSTRACT

An integrated circuit structure includes a substrate; two insulation regions over the substrate, with one of the two insulation regions including a void therein; and a first semiconductor strip between and adjoining the two insulation regions. The first semiconductor strip includes a top portion forming a fin over top surfaces of the two insulation regions.

20 Claims, 8 Drawing Sheets

(56) References Cited

U.S. PATENT DOCUMENTS

| | | |
|---|---|---|
| 2007/0128782 A1 | 6/2007 | Liu et al. |
| 2007/0132053 A1 | 6/2007 | King et al. |
| 2008/0111199 A1* | 5/2008 | Kim et al. .................. 257/401 |
| 2008/0277739 A1 | 11/2008 | Curatola |
| 2008/0290470 A1 | 11/2008 | King et al. |
| 2008/0296632 A1 | 12/2008 | Moroz et al. |
| 2009/0174040 A1 | 7/2009 | Gogoi et al. |
| 2009/0181477 A1 | 7/2009 | King et al. |

* cited by examiner

VOIDS IN STI REGIONS FOR FORMING BULK FINFETS

This application is a divisional of U.S. patent application Ser. No. 12/612,442, filed Nov. 4, 2009, and entitled "Voids in STI Regions for Forming Bulk FinFETs," which application further claims the benefit of U.S. Provisional Application No. 61/251,587 filed on Oct. 14, 2009, and entitled "Voids in STI Regions for Forming Bulk FinFETs," which applications are hereby incorporated herein by reference.

TECHNICAL FIELD

This application relates generally to integrated circuits and more particularly to structures and manufacturing methods of shallow trench isolation (STI) regions and semiconductor fins.

BACKGROUND

With the increasing down-scaling of integrated circuits and increasingly demanding requirements to the speed of integrated circuits, transistors need to have higher drive currents with increasingly smaller dimensions. Fin field-effect transistors (FinFET) were thus developed. FIG. 1 illustrate a cross-sectional view of a conventional FinFET, wherein the cross-sectional view is made crossing the fin rather than the source and drain regions. Fins 100 are formed as vertical silicon fins extending above substrate 102 and are used to form source and drain regions (not shown) and channel regions therebetween. Shallow trench isolation (STI) regions 120 are formed to define fins 100. Gate 108 is formed over fins 100. Gate dielectric 106 is formed to separate fins 100 from gate 108.

It is realized that the parasitic capacitance (shown with capacitors 110) is generated between gate 108 and semiconductor strips 122, wherein STI regions 120 act as the insulator of parasitic capacitor 110. The parasitic capacitance adversely affects the performance of the respective integrated circuit, and needs to be reduced.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

A novel method for forming a shallow trench isolation (STI) region and a fin field-effect transistor (FinFET) is provided. The intermediate stages in the manufacturing of an embodiment are illustrated, and variations of the embodiment are discussed. Throughout the various views and illustrative embodiments, like reference numbers are used to designate like elements.

Figure 1:
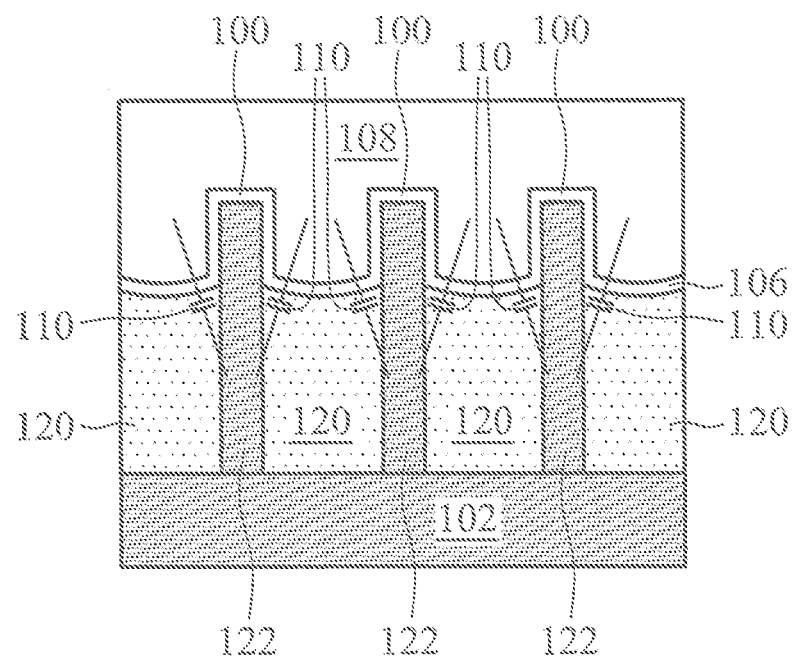
FIG. 1 illustrates a cross-sectional view of a conventional FinFET.
Figure 2:
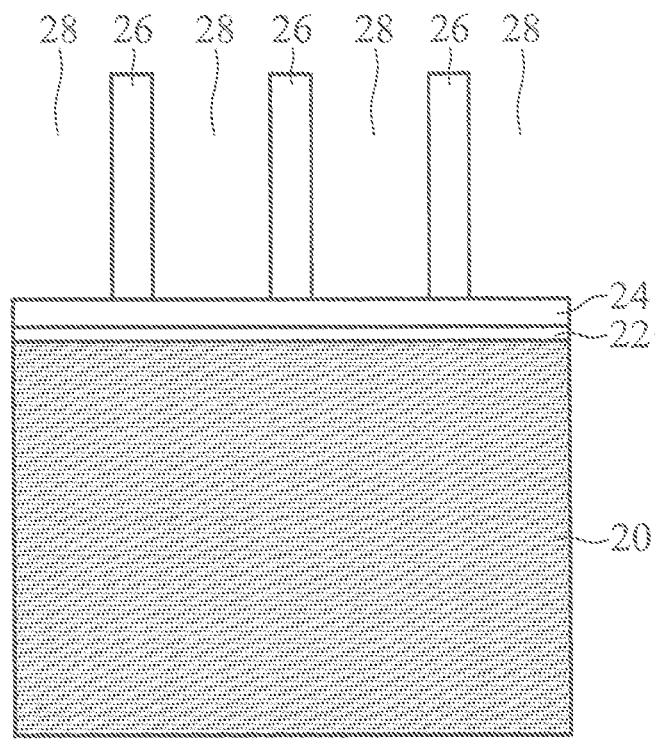
FIGS. 2 through 9 are cross-sectional views of intermediate stages in the manufacturing of a FinFET in accordance with an embodiment.

Referring to FIG. 2, semiconductor substrate 20 is provided. In an embodiment, semiconductor substrate 20 includes silicon. Other commonly used materials, such as carbon, germanium, gallium, arsenic, nitrogen, indium, and/or phosphorus, and the like, may also be included in semiconductor substrate 20. Semiconductor substrate 20 may be a bulk substrate or a semiconductor-on-insulator (SOI) substrate.

Pad layer 22 and mask layer 24 may be formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In an embodiment, mask layer 24 is formed of silicon nitride, for example, using low-pressure chemical vapor deposition (LPCVD). In other embodiments, mask layer 24 is formed by thermal nitridation of silicon, plasma enhanced chemical vapor deposition (PECVD), or plasma anodic nitridation. Mask layer 24 is used as a hard mask during subsequent photolithography processes. Photo resist 26 is formed on mask layer 24 and is then patterned, forming openings 28 in photo resist 26.

Figure 3:
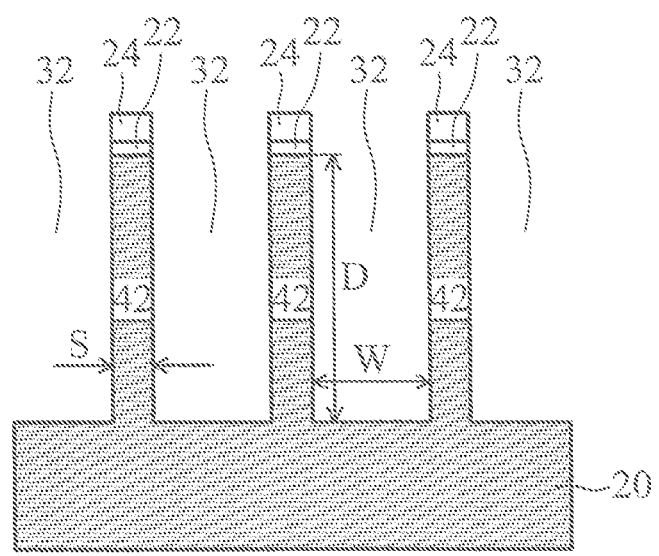

Referring to FIG. 3, mask layer 24 and pad layer 22 are etched through openings 28, exposing underlying semiconductor substrate 20. The exposed semiconductor substrate 20 is then etched, forming trenches 32. Portions of semiconductor substrate 20 between trenches 32 form semiconductor strips 42. Trenches 32 may be strips (in the top view) parallel to each other, and closely located relative each other. For example, the spacing S between trenches 32 may be smaller than about 30 nm. Photo resist 26 is then removed. Next, a cleaning may be performed to remove a native oxide of semiconductor substrate 20. The cleaning may be performed using diluted hydrofluoric (HF) acid.

Depth D of trenches 32 may be between about 2100 Å and about 2500 Å, while width W is between about 300 Å and about 1500 Å. In an exemplary embodiment, the aspect ratio (D/W) of trenches 32 is greater than about 7.0. In other exemplary embodiments, the aspect ratios may even be greater than about 8, although they may also be lower than about 7.0, or between 7.0 and 8.0. One skilled in the art will realize, however, that the dimensions and values recited throughout the descriptions are merely examples, and may be changed to suit different scales of integrated circuits.

Figure 4:
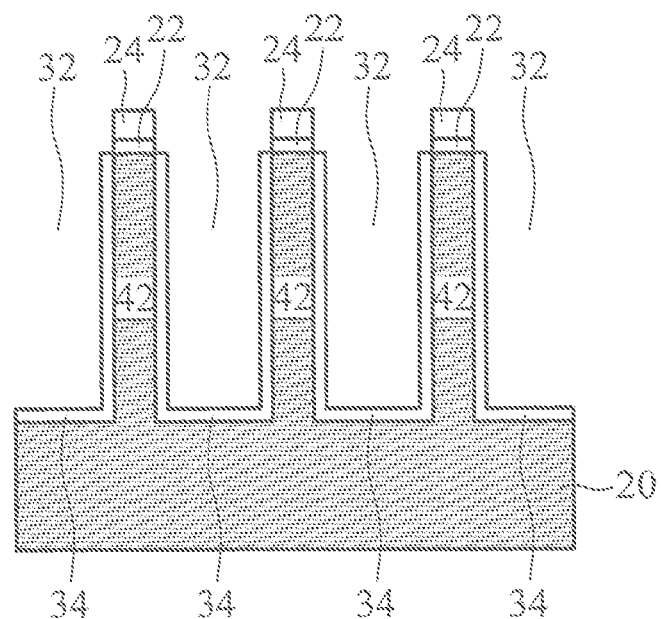

Liner oxide 34 is then formed in trenches 32, as is shown in FIG. 4. In an embodiment, liner oxide 34 may be a thermal oxide having a thickness between about 20 Å to about 500 Å. In other embodiments, liner oxide 34 may be formed using in-situ steam generation (ISSG). In yet other embodiments, liner oxide 34 may be formed using a deposition technique that can form conformal oxide layers, such as selective area chemical vapor deposition (SACVD) and the like. The formation of liner oxide 34 rounds the corners of trenches 32, which reduces the electrical fields, and hence improves the performance of the resulting integrated circuit.

Figure 5A:
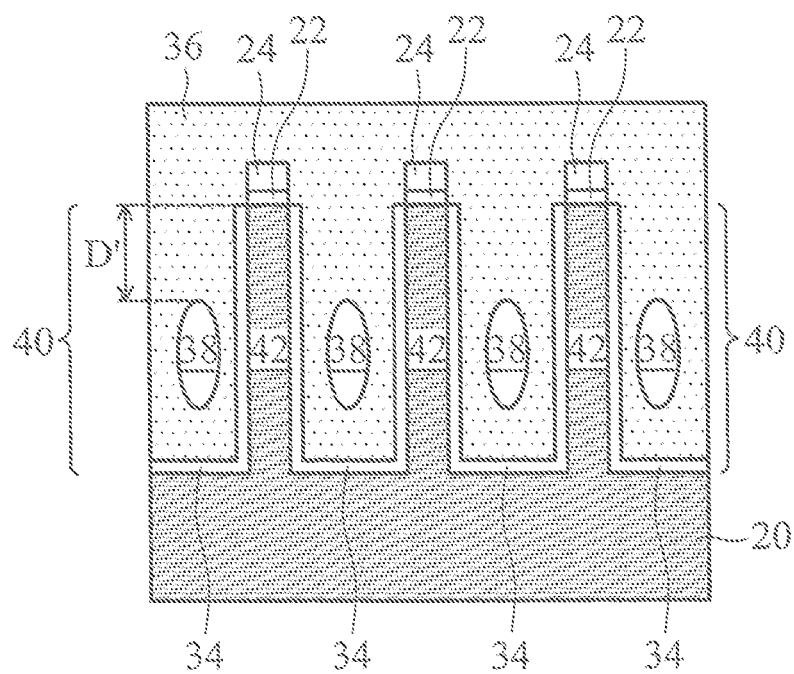
Figure 5B:
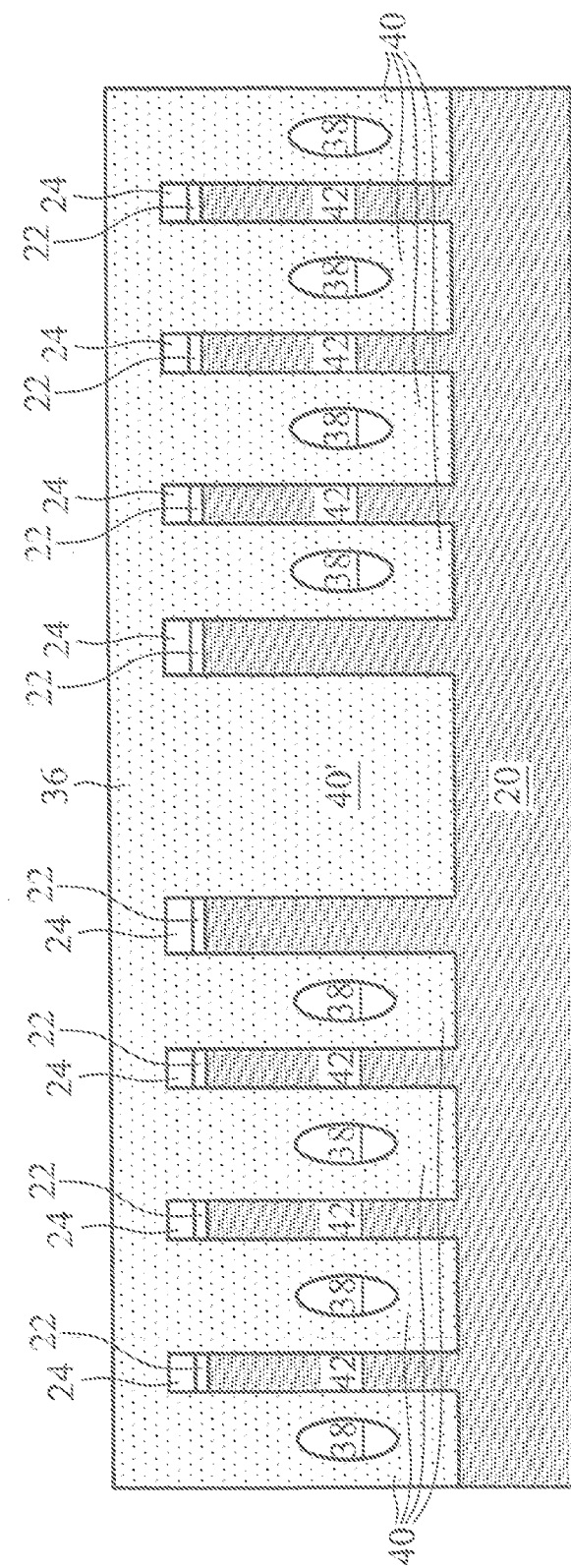
Figure 5C:
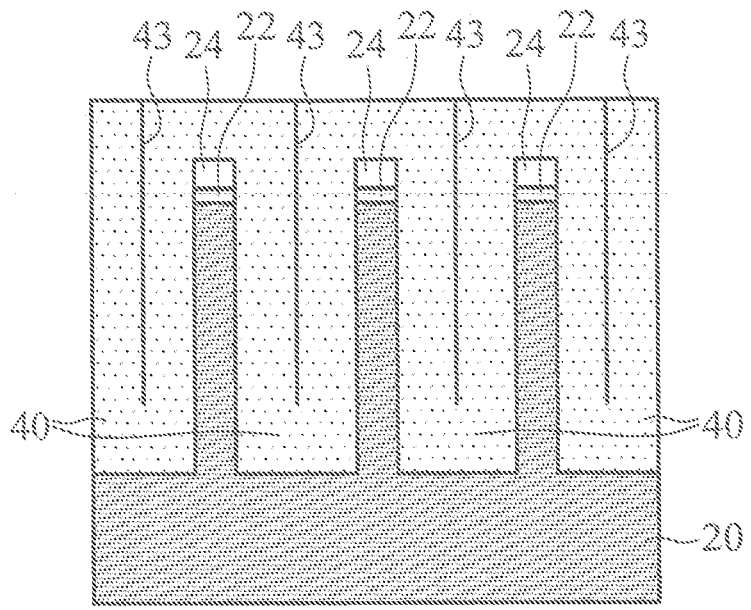

Referring to FIGS. 5A, 5B and 5C, trenches 32 are filled with dielectric material 36. Dielectric material 36 may include silicon oxide, and hence may be referred to as oxide 36 hereinafter, although other dielectric materials, such as SiN, SiC, or the like, may also be used. In an embodiment, oxide 36 is formed using a high aspect-ratio process (HARP). The processes gases may include tetraethylorthosilicate (TEOS) and $O_3$ (ozone). The portions of oxide 36 and liner oxide 34 in trenches 32 are referred to as shallow trench isolation (STI) regions 40 hereinafter. For simplicity, liner oxide 34 is not shown in FIGS. 5B, 5C and subsequent drawings.

Voids 38 may be formed in oxide 36. In an embodiment, voids 38 may be formed by selecting an appropriate method such as HARP that may help form voids in oxide 36 and adopting appropriate process conditions. Semiconductor strips 42 may be used to form a single FinFET (refer to FIGS. 8A and 9), although they can also be used to form multiple FinFETs. Accordingly, STI regions 40 between fins 42 are referred to as intra-device STI regions. Conversely, STI region 40' (FIGS. 5B and 9) between FinFETs is referred to as an inter-device STI region. In an embodiment, intra-device STI regions 40 have voids 38 formed therein, while inter-device STI region 40' does not have voids formed therein. Voids are more likely to be generated in trenches having greater aspect ratios. Further, inter-device STI region 40' may have a smaller aspect ratio than the aspect ratios of intra-device STI regions 40. Accordingly, the formation of voids 38 in intra-device STI regions 40 (but not in inter-device STI regions 40') may be achieved by selecting an appropriate method for forming oxide 36, and selecting appropriate aspect ratios for intra-device STI regions 40 and inter-device STI regions 40'.

Figure 7A:
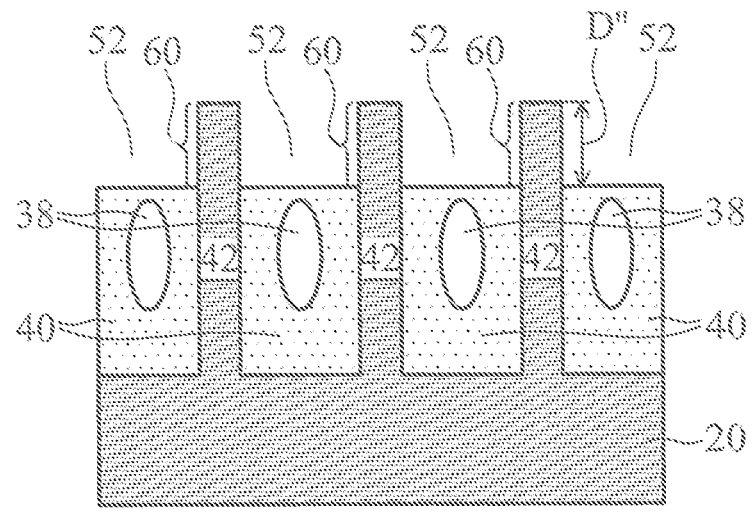
Figure 7B:
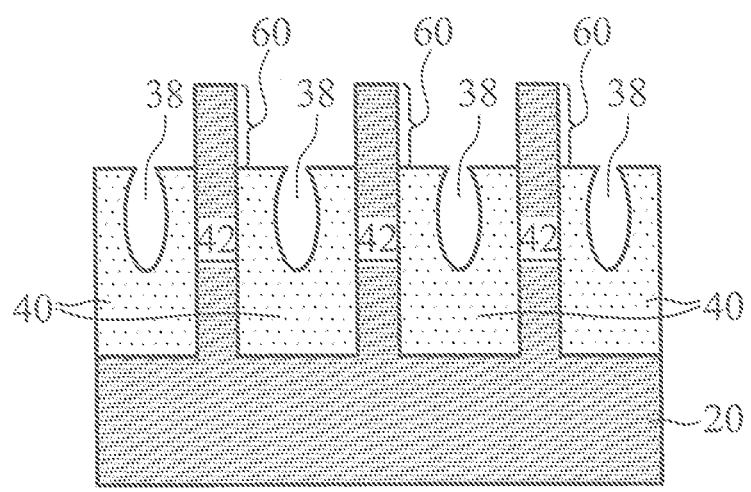
Figure 8A:
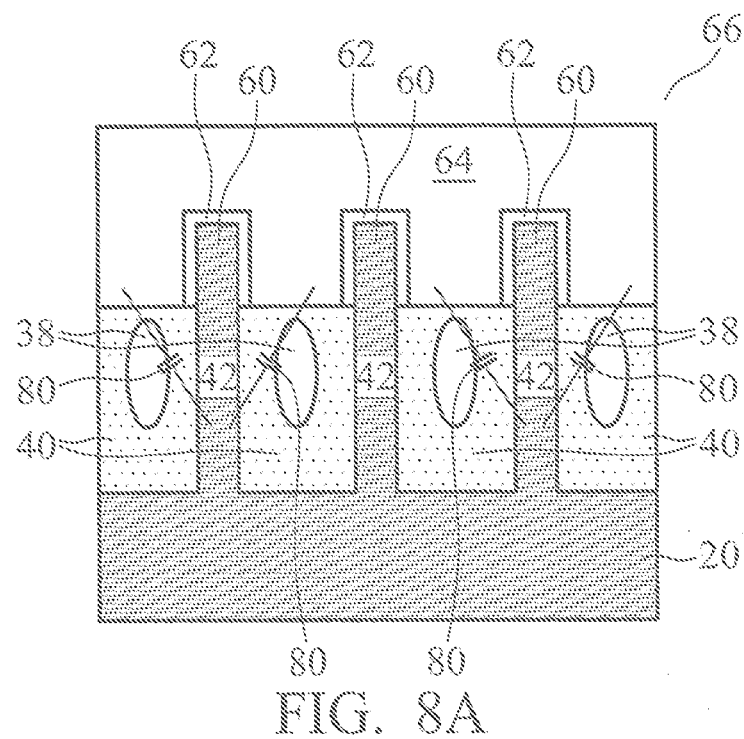
Figure 8B:
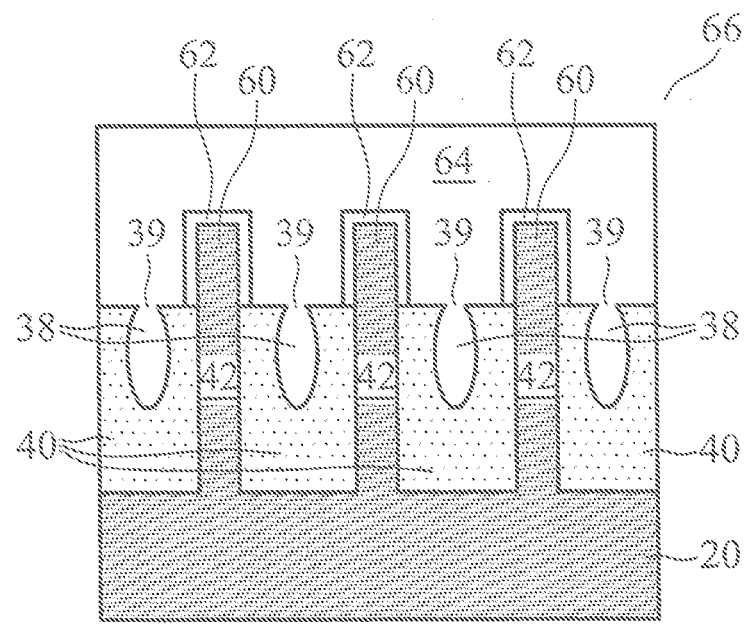
Figure 9:
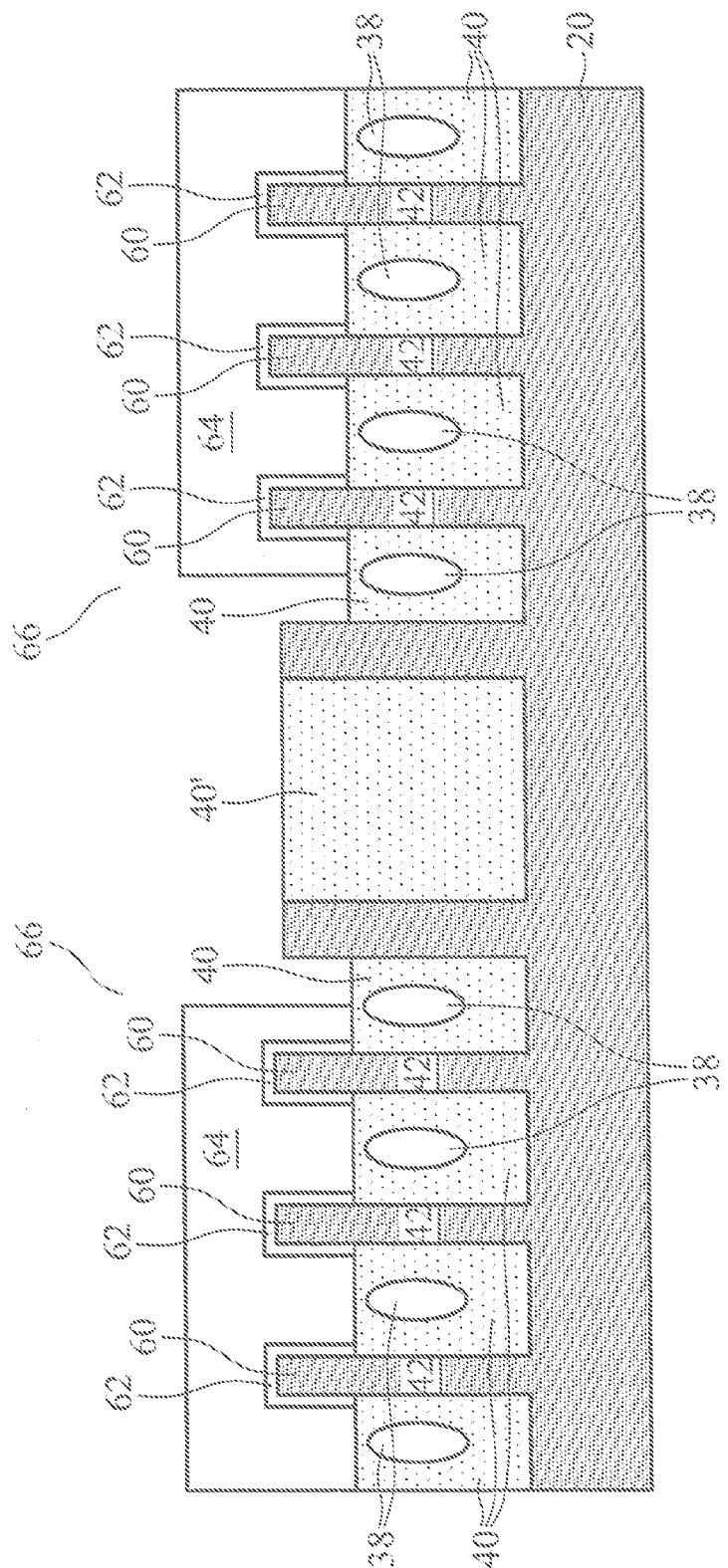

In addition, voids 38 are desirably left in the structure after the formation of the FinFET device (please refer to FIGS. 8A through 9). Accordingly, the desirable position of voids 38 are affected by the amount of STI regions to be removed in subsequent recessing steps (FIGS. 7A and 7B). In an embodiment, the top ends of voids 38 are vertically spaced apart from the top surfaces of fins 42 by distance D' (FIG. 5A) that is greater than about 25 nm. This may be achieved, for example, by adjusting the process conditions in the formation of oxide 36 such as the deposition rate, the flow rates of the process gases, the temperature of substrate 20, and the like. In an exemplary embodiment, STI regions 40 are formed with TEOS and ozone as process gases under a sub-atmospheric pressure, which may be greater than about 500 Torr. The pressure of the process gases in the forming chamber may also be between about 500 Torr and about 760 Torr. The flow rate of TEOS may be greater than about 10 sccm, while the flow rate of ozone may be greater than about 10 sccm. The high gate flow rate and high gas pressure facilitates the formation of voids.

In alternative embodiments, as shown in FIG. 5C, no voids 38 are formed. However, portions of oxide 36 grown on opposite sidewalls of trenches 32 join each other to form seam 43 at the center of trenches 32. Seams 43 are weak portions of oxide 36 due to the high density of dangling bonds.

Figure 6:
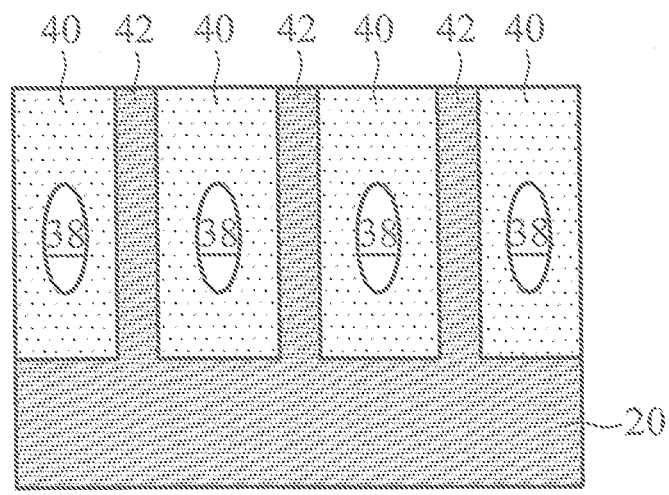

A chemical mechanical polish is then performed, followed by the removal of mask layer 24 and pad layer 22. The resulting structure is shown in FIG. 6. Mask layer 24, if formed of silicon nitride, may be removed by a wet process using hot $H_3PO_4$, while pad layer 22 may be removed using diluted HF acid if formed of silicon oxide.

Next, the structure shown in FIG. 6 may be used to form fins, which are further used for forming a FinFET. As shown in FIGS. 7A and 7B, STI regions 40 are recessed by etching, resulting in recesses 52. The portions of semiconductor strips 42 protruding over the top surfaces of the remaining STI regions 40 thus become fins 60. In an embodiment, the recessing of oxide 36 includes a wet dip, for example, in a diluted hydrofluoric (HF) acid solution. In alternative embodiment, the etching is a dry etching. Depth D" of recess 52 may be between 15 nm and about 50 nm.

Referring to FIG. 7A, voids 38 are embedded in, and enclosed by, the remaining portions of STI regions 40. In FIG. 7B, voids 38 may be exposed to external environment. However, the openings of voids 38 are small. In the embodiment shown in FIG. 5B, since seams 43 (FIG. 5C) are weak portions of STI regions 40, during the recessing of STI regions 40 seams 43 may be etched faster than other portions, so that voids 38 are formed. Further, if voids 38 were already formed before the recessing of STI regions 40, the exposed voids may be expanded.

Referring to FIG. 8A, gate dielectric 62 is formed to cover the top surface and sidewalls of fins 60. Gate dielectric 62 may be formed by a thermal oxidation, and hence may include a thermal silicon oxide. In this embodiment, gate dielectric 62 is formed on the top surfaces of fins 60, but not on the top surfaces of STI regions 40. Alternatively, gate dielectric 62 may be formed by a deposition step. Accordingly, gate dielectric 62 is formed on the top surfaces of fins 60 and the top surfaces of STI regions 40. Gate electrode 64 is then formed on gate dielectric 62. In an embodiment, as shown in FIGS. 8A and 8B, gate electrode 64 covers more than one fin 60, so that the resulting FinFET 66 is a multi-fin FinFET. In alternative embodiments, each of fins 60 may be used to form one FinFET. The remaining components of FinFET 66, including source and drain regions and source and drain silicides (not shown) are then formed. The formation processes of these components are known in the art, and hence are not repeated herein.

FIG. 8B illustrates another embodiment formed from the structure shown in FIG. 7B. Although voids 38 are exposed through the top surfaces of STI regions 40, openings 39 are small enough such that after the formation of gate electrode 64, openings 39 of voids 38 are sealed by gate electrode 64, and voids 38 are not filled.

It is appreciated that although in the embodiments as shown in FIGS. 5A through 9, only one void 38 is shown in each of STI regions 40, the number of voids in each of STI regions 40 may be greater than one, and the multiple voids in a single STI region 40 may be scattered throughout STI regions 40.

FIG. 9 illustrates both an inter-device STI region 40' and intra-device STI regions 40, which structure is formed from the structure shown in FIG. 5C. It is noted that inter-device STI region 40', which does not have any gate electrode directly above it, does not comprise any void. As a comparison, intra-device STI regions 40, which may be directly under gate electrodes 64, may comprise voids 38.

The embodiments have several advantageous features. Voids are formed in the STI regions underlying gate electrodes of FinFETs. Since voids are air pockets that have a k value equal to 1, the effective k value of the entire STI regions 40 is reduced. The capacitance of parasitic capacitors 80 (FIG. 8A) is reduced. The performance of the resulting integrated circuits is thus improved.

In accordance with one embodiment, an integrated circuit structure includes a substrate; two insulation regions over the substrate, with one of the two insulation regions including a void therein; and a first semiconductor strip between and adjoining the two insulation regions. The first semiconductor strip includes a top portion forming a fin over top surfaces of the two insulation regions.

Other embodiments are also disclosed.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
   two insulation regions over a substrate, each of the two insulation regions comprising a solid material, wherein one of the two insulation regions comprises a void therein;
   a first semiconductor strip between and adjoining the two insulation regions, wherein the first semiconductor strip comprises a top portion forming a fin over top surfaces of the two insulation regions;
   a gate dielectric over a top surface and sidewalls of the fin, wherein the void is not under any portion of the gate dielectric; and
   a gate electrode over the gate dielectric.

2. The integrated circuit structure of claim 1, wherein the gate electrode comprises a portion directly over the void.

3. The integrated circuit structure of claim 1 further comprising a second semiconductor strip, wherein the one of the two insulation regions is between and adjoining the first semiconductor strip and the second semiconductor strip, and wherein the gate dielectric and the gate electrode extend over the first semiconductor strip and the second semiconductor strip.

4. The integrated circuit structure of claim 1 further comprising an additional insulation region horizontally spaced apart from the gate electrode, wherein the additional insulation region is not under any gate electrode of any FinFET, and wherein the additional insulation region does not comprise any void.

5. The integrated circuit structure of claim 1, wherein the gate electrode is exposed to the void.

6. The integrated circuit structure of claim 1, wherein the void has a top end lower than a top surface of the one of the two insulation regions.

7. The integrated circuit structure of claim 1, wherein the first semiconductor strip is formed of a same semiconductor material as the substrate.

8. An integrated circuit structure comprising:
   a first semiconductor strip over a semiconductor substrate;
   a second semiconductor strip over the semiconductor substrate;
   a first shallow-trench isolation (STI) region over the substrate and between and adjoining the first semiconductor strip and the second semiconductor strip, wherein the first STI region comprises a void therein, and wherein a portion of the first semiconductor strip over a top surface of the first STI region forms a first fin, and a portion of the second semiconductor strip over the top surface of the first STI region forms a second fin;
   a second STI region over the substrate, wherein the second STI region does not comprise any void;
   a gate dielectric over top surfaces and sidewalls of the first fin and the second fin; and
   a gate electrode over the gate dielectric, wherein the gate electrode is directly over the void, the first fin, and the second fin.

9. The integrated circuit structure of claim 8, wherein the first STI region is an intra-device STI region, and wherein the second STI region is an inter-device STI region.

10. The integrated circuit structure of claim 8, wherein the void is embedded in the first STI region.

11. The integrated circuit structure of claim 8, wherein the gate electrode adjoins the void.

12. The integrated circuit structure of claim 8, wherein the first semiconductor strip, the second semiconductor strip, and the semiconductor substrate are formed of silicon, and wherein the first semiconductor strip and the second semiconductor strip are continuously connected to the semiconductor substrate.

13. The integrated circuit structure of claim 8, wherein the first STI region has a top surface lower than a top surface of the second STI region.

14. The integrated circuit structure of claim 8 further comprising a third semiconductor strip over the semiconductor substrate, the third semiconductor strip having a top surface coplanar with a top surface of the second STI region.

15. An integrated circuit structure comprising:
    a first plurality of fins over a substrate, the first plurality of fins being spaced apart from one another by respective first isolation regions each having a first width, the first isolation regions comprising voids;
    a second plurality of fins over a substrate;
    a second isolation region laterally between the first plurality of fins and the second plurality of fins, the second isolation region having a second width, the second width being greater than the first width, the second isolation region having a top surface higher than the top surfaces of the first isolation regions;
    a gate dielectric over at least one of the first plurality of fins; and
    a gate electrode over the gate dielectric.

16. The integrated circuit structure of claim 15, wherein the first isolation regions and second isolation region further comprise a liner oxide.

17. The integrated circuit structure of claim 15 further comprising:
    third isolation regions spacing apart the second plurality of fins, the third isolation regions each having a third width, the third isolation regions comprising voids;
    the gate dielectric over at least one of the second plurality of fins; and
    a second gate electrode over the gate dielectric.

18. The integrated circuit structure of claim 17, wherein the second gate electrode is over at least three of the second plurality of fins.

19. The integrated circuit structure of claim 17, wherein the first isolation regions and the third isolation regions are intra-device isolation regions, and wherein the second isolation region is an inter-device isolation region.

20. The integrated circuit structure of claim 15, wherein the gate electrode is over at least three of the first plurality of fins.

* * * * *